United States Patent [19]

Redfield

[11] Patent Number: 4,562,365

[45] Date of Patent: Dec. 31, 1985

[54] CLOCKED SELF BOOTING LOGICAL "EXCLUSIVE OR" CIRCUIT

[75] Inventor: James W. Redfield, Pottstown, Pa.

[73] Assignee: Commodore Business Machines Inc., West Chester, Pa.

[21] Appl. No.: 456,263

[22] Filed: Jan. 6, 1983

[51] Int. Cl.[4] .................... H03K 19/21; H03K 19/096
[52] U.S. Cl. .................................. 307/471; 307/453; 307/481; 307/482
[58] Field of Search ............... 307/443, 445, 448, 453, 307/471, 269, 480–482, 577–578, 583

[56] References Cited

U.S. PATENT DOCUMENTS

| | | | |
|---|---|---|---|
| 3,569,729 | 3/1971 | Washizuka et al. | 307/471 X |
| 3,579,275 | 5/1971 | Polkinghorn et al. | 307/443 |
| 3,602,732 | 8/1971 | Suzuki | 307/471 |
| 3,651,334 | 3/1972 | Thompson et al. | 307/453 X |
| 4,207,476 | 6/1980 | Upadhyayula | 307/471 |
| 4,367,420 | 1/1983 | Foss et al. | 307/453 |

Primary Examiner—Stanley D. Miller
Assistant Examiner—D. R. Hudspeth
Attorney, Agent, or Firm—John J. Simkanich

[57] ABSTRACT

A solid state logical "EXCLUSIVE OR" circuit for implementation in NMOS circuitry utilizes existing non-overlapping clock pulses for self-booting circuit conditioning, enabling ultrafast propagation times and minimal power drain during circuit operation, whereof row driver circuit design concepts are utilized and silicon area is minimized and two, non-overlapping, low impedance pulses, normally present in the circuit environment are utilized.

10 Claims, 2 Drawing Figures

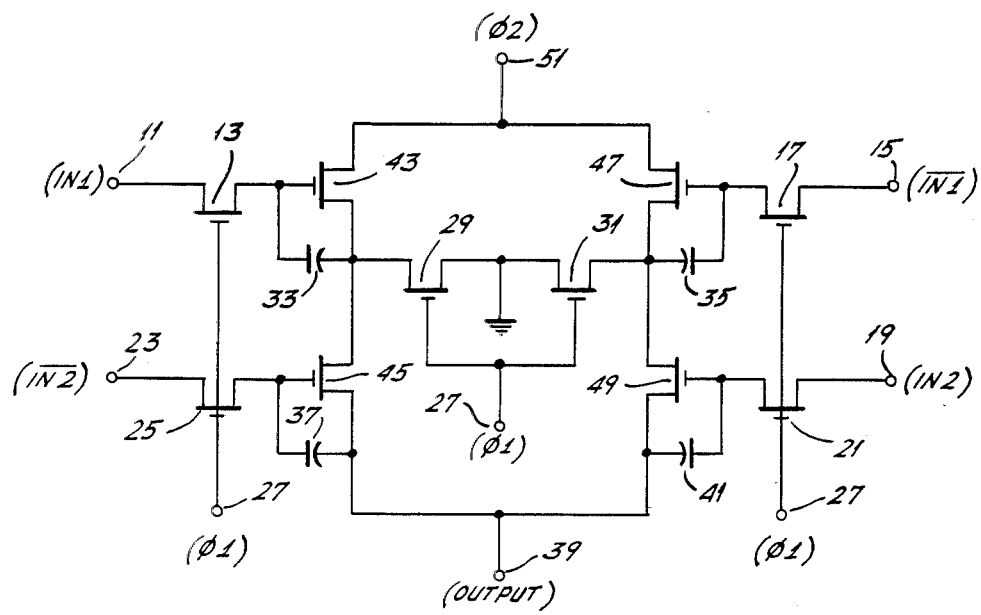
FIG. 1. "EXCLUSIVE OR" CIRCUIT
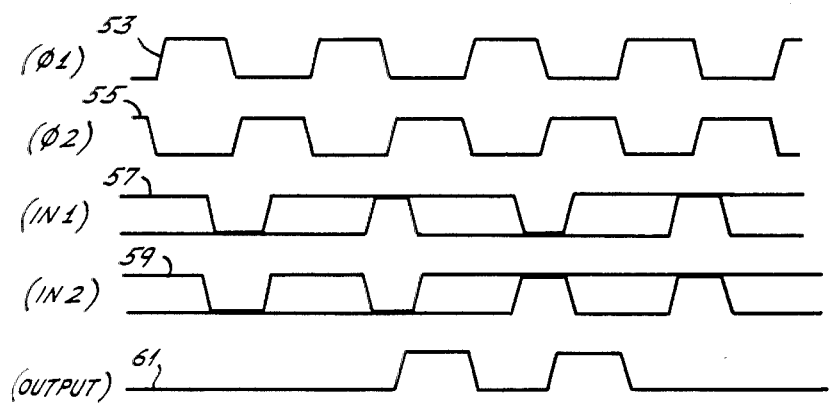
FIG. 2.

CLOCKED SELF BOOTING LOGICAL "EXCLUSIVE OR" CIRCUIT

BACKGROUND OF THE INVENTION

This invention relates to solid state circuits having specific dedication to certain functions in digital logic or arithmetic circuitry. Specifically, it relates to circuits for performing "EXCLUSIVE OR" functions, and especially that class of circuitry known as EXCLUSIVE OR "gates" which are implemented within large scale integrated circuits (LSI) with NMOS technology.

Certain design methodologies have dominated circuit design approaches in the past. One of these was that high speed circuitry generally requires more power and takesup more silicon area than low speed circuitry. High speed circuits are more desirable in any application. However, with the advent of mini-computers, micro-processors and LSI circuitry, it has become increasingly desirable to increase circuit speed (i.e. minimize propagation (or delay times) while still minimizing power consumption and size (i.e. silicon area needed to implement a circuit).

Arithmetic decision making or logic functions used in computing hardware are almost always operated with clock pulses. Such clock pulses assure synchronous operation, minimize data (bit information) loss and minimize errors.

An object of the present invention is to utilize the existence of low impedance, non-overlapping clock pulses in logic function operation.

A second object of this invention is to provide such a logic function operation in a circuit which may be operated at much higher speeds than is normally possible using conventional design methodologies.

A further object of this invention is to provide such a logic circuit which utilizes such clock pulse signals to precondition the circuit enabling a fast rise or trigger, i.e. high speed propagation, the application of such preconditioning causing a "self booting" effect on the circuit.

SUMMARY OF THE INVENTION

The objects of this invention are realized in a large scale integrated circuit (LSI) implementation of NMOS technology where a first timing clock pulse is used to condition the circuit by building a voltage level on the circuit prior to the logical function operation of the circuit thereby minimizing the power drain by the circuit during its logical function operation.

A second clock pulse, which like the first clock pulse, is normally present in the environment in which the invention is used, the second clock pulse being a non-overlapping pulse with the first, is used to clock the logical function operation of the circuit.

Ten field effect transistors (FET's) are utilized. Four of these Fet's are connected in a classical "box" or double row circuit for performing the logical "EXCLUSIVE OR" function. Conditioning capacitors are connected between gate and source pins of these FET's for effecting a charge build-up and limiting the value of this charge for performing a preconditioning of the circuit.

A pair of FET's are used to trim the falling edge of the output pulse of the circuit, while four FET's are connected, one each, respectively, on each input of the circuit to isolate the respective inputs during the functional triggering of the circuit.

DESCRIPTION OF THE DRAWINGS

The advantages, features and operation of the invention will be readily understood from a reading of the following detailed description in conjunction with the accompanying drawings in which like numerals refer to like elements and in which:

FIG. 1 is a diagram of the circuit of the logical "EXCLUSIVE OR" device; and

FIG. 2 is a timing diagram for the operation of the circuit of FIG. 1.

DETAILED DESCRIPTION OF THE INVENTION

A logical "EXCLUSIVE OR" function is implemented in a large scale integrated circuit (LSI) in NMOS technology having a first circuit input (In 1) node 11, FIG. 1, connected to the drain pin of a first FET 13. A second input node 15 receives a complement input (IN 1). This second input node 15 is connected to the drain pin of a second FET 17. A third input (In 2) appears on a third input node 19 and is connected to the drain pin of a third FET 21. The inverse signal (IN 2) appears on a fourth input node 23 which is connected to the drain pin of a fourth FET 25.

The gate pins of the first, second, third and fourth FETs 13, 17, 21, 25 are each connected to a first clock pulse ($\Phi$1) which appears on circuit node 27. This first clock pulse node 27 is also connected to the gate pins of a fifth and sixth FETs 29, 31, respectively.

The source pin of the first FET 13 is connected to the drain pin of the fifth FET 29 through a first capacitor 33. The source pin of the second FET 17 is, likewise, connected to the drain pin of the sixth FET 31 through a second capacitor 35. The source pins of each of the fifth and sixth FETs 29, 31 are connected to ground. A third capacitor 37 is connected between the source pin of the fourth FET 25 and the output of the circuit node 39. Likewise, a fourth capacitor 41 is connected between the source pin of the third FET 21 and the circuit output node 39.

A seventh FET 43 is connected on its gate pin to the source pin of the first FET 13 and its source pin to the drain pin of the fifth FET 29. An eighth FET 45 is connected on its drain pin to the source pin of the seventh FET 43, on its gate pin to the source pin of the fourth FET 25, and on its source pin to the circuit output node 39.

A ninth FET 47 is connected on its gate pin to the source pin of the second FET 17 and on its source pin to the drain pin of the sixth FET 31. A tenth FET 49 is connected on its drain pin to the source pin of the ninth FET 47, on its gate pin to the source pin of the third FET 21, and on its source pin to the circuit output node 39.

A second clock pulse ($\Phi$2), being a non-overlapping clock pulse to the first clock pulse, appearing on node 27, appears on circuit node 51 which is connected to the drain pins of each of the seventh and ninth FETs 43, 47.

The timing diagram for the clocked, self-booting logical "EXCLUSIVE OR" circuit is seen as FIG. 2.

Line 53 of FIG. 2 represents the first low impedance clock pulse ($\Phi$1) appearing on clock pulse node 27 of the circuit. Line 55 represents the inverse signal of line 53 and is the second clock pulse appearing on the circuit node 51.

Line 57 shows the first input node 11 signal (IN 1), while line 59 shows the second input signal (IN 2) appearing on the third input node 19 of the circuit. The inverse signals to those shown in lines 57 and 59 are applied to circuit node 15 and 23, respectively.

Line 61 shows the output of the circuit appearing on node 39.

In a first phase of operation, the circuit is under the influence of the first clock pulse appearing on node 27. This clock pulse is "high" allowing for the gating through into the circuit, each of the signals appearing on the input nodes 11, 15, 19 and 23. During the second phase of operation of the circuit, the clock pulse (Φ1) goes "low", isolating all of the input nodes 11, 15, 19, 23 from the surrounding logic circuitry and allowing for the invention to operate under the effects of the second clock pulse (Φ2) appearing at the circuit node 51. When this second clock pulse at circuit node 51 is "high", the logical operation of the circuit is conducted and the output appears at circuit node 39.

The capacitors 33, 35, 37, and 41 replace the function of depletion transistors and are included to help minimize charge redistribution on the parasitic capacitive source region of the input gate FETs 13, 17, 21, and 25, thus providing higher boot voltage on the gate of each of the FETs 43, 47, 49 and 45, respectively, which FETs perform the logical "EXCLUSIVE OR" function. These capacitors 33, 35, 37 and 41 also provide noise immunity, when any of the functional operational FETs 43, 45, 47 or 49 have been preconditioned to a low voltage level by "soaking up" charges which is pumped onto the gates of those FETs due to gate overlap operation into the time period given to the drain region (falling edge) of the second clock pulse appearing on the circuit node 51. These capacitors 33, 35, 37, 41 enable the circuit to operate more efficiently, but are not necessary to its operation.

The fifth and sixth FETs 29, 31, which are inactivated as the first clock pulse appearing on circuit node 27 goes "high", are utilized to trim the falling edge of the circuit output signal appearing on circuit node 39.

This structure allows for a very fast response time, the output signal appearing on circuit node 39 in three to eight nano seconds behind the rising edge of the second clock pulse (Φ2) appearing on circuit node 51. There is no static path to ground when non-overlapping input clock signals, which are normally available in the environment in which the invention is used, are connected to the circuit nodes 27 and 51. The circuit, therefore, draws no DC current and the effective power consumption of the circuit is limited to that which occurs during the logical "EXCLUSIVE OR" operation while the second clock pulse (Φ2) appearing on circuit node 51 is high. This AC power is only that which is necessary to charge and discharge the output node 39.

The circuit, therefore, preconditions each of the logical function performing FETs 43, 45, 47 and 49 while the non-operational clock pulse (Φ1) is "high" and the output node 39 is isolated from the input nodes 11, 15, 19, 23. The circuit output 39 is clocked through by the operational clock pulse (Φ2) appearing at circuit node 51 when this second clock pulse (Φ2) is "high", and the input nodes 11, 15, 19, 23 are isolated from the circuit. The operation of the fifth and sixth FETs 29, 31 enables the fast fall-off of the output signal to a "low" and a fast latching of the circuit to the low voltage level.

Where silicon area is at a premium, and the operation of the circuit is not so critical that a slower roll-off or slower fall-off time is acceptable for the output pulse, the fifth and sixth FETs 29, 31 can be eliminated from the circuit. The present design minimizes silicon area by reducing the number of active components needed to carry out the "EXCLUSIVE OR" logical function, while providing for fast propagation times and minimizing power consumption.

It is intended that the above description is to be taken as illustrative and not in the limiting sense as a number of variations and modifications can be made to the invention without departing from the intent and scope thereof.

What is claimed is:

1. A logic EXCLUSIVE OR circuit having two pairs of input nodes and an output node for providing an "EXCLUSIVE OR" function on its output node in response to signals received on said its inputs nodes where a first and a second non-overlapping clock pulses are present, comprising:
   a first, second, third and fourth gate enabled switching means being connected for receiving two input signals and the inverse signals thereof from said two pairs of inputs nodes, for providing an said output in the presence of one and only one of said two input signals, but not otherwise;
   a fifth, sixth, seventh, and eighth gate enabled switching means being connected for selectively isolating and connecting said two pairs of inputs nodes from said first, second, third and fourth gate operated means; and
   wherein said first clock pulses are received by said fifth, sixth, seventh and eighth switching means thereby controlling their conduction and said second clock pulses are received by said first and second switching means.

2. The EXCLUSIVE OR circuit of claim 1 also including a ninth and tenth gate enabled switching means for shunting the signal from said output of said first and second means to ground, said ninth and tenth switching means being connected thereto.

3. The EXCLUSIVE OR circuit of claim 2 wherein said fifth, sixth, seventh and eighth switching means are enabled to conduction only in the presence of said first clock pulses received.

4. The EXCLUSIVE OR circuit of claim 3 wherein said ninth and tenth switching means are enabled to conduction only in the presence of said first clock pulses received.

5. The EXCLUSIVE OR circuit of claim 4 wherein said first and second switching means each receive said second clock pulses.

6. The EXCLUSIVE OR circuit of claim 5 wherein said first switching means is conncted to said third switching means and said second switching means is connected to said fourth switching means.

7. The EXCLUSIVE OR circuit of claim 6 also including means for providing a higher switching signal level for each of said first, second, third and fourth switching means.

8. The EXCLUSIVE OR circuit of claim 7 wherein said higher switching signal level providing means includes a plurality of capacitors connected one each respectively between a switch control gate and an ouput of said first, second, third and fourth switching means.

9. The EXCLUSIVE OR circuit of claim 8 wherein each switching means is a single FET each having a drain, source and gate electrodes wherein said first FET and said second FET are each connected on their drain electrode to receive said second clock pulses, said third FET drain electrode is connected to said second FET source electrode, said third and fourth FET source electrodes are connected together and to said output node, said fifth FET is connected, drain electrode to source electrode, between a first one of said input nodes and said first FET gate electrode, said sixth FET is connected, drain electrode to source electrode, between a second one of said input nodes and said fourth FET gate electrode, said seventh FET is connected, drain electrode to source electrode, between a third one of said input nodes and said second FET gate electrode, said eighth FET is connected, drain electrode to source electrode, between a fourth one of said input nodes and said third FET gate electrode said second FET source electrode is connected to said fourth FET drain electrode, and said fifth, sixth, seventh an eighth FET gate electrodes are each connected to receive said first clock pulses.

10. The circuit of claim 9 also wherein said ninth FET is connected, drain electrode to source electrode, between said first FET source electrode and ground, said tenth FET is connected, drain electrode to source electrode, between said second FET source electrode and ground, said ninth and tenth FET gate electrodes and each connected to receive said first clock pulses, and wherein a first one of said capacitors is connected across said first FET gate electrode to source electrode, a second one of said capacitors is connected across said second FET gate electrode to source electrode, a third one of said capacitors is connected across said third FET gate electrode to source electrode, and a fourth one of said capacitors is connected across said fourth FET gate electrode to source electrode.

* * * * *

UNITED STATES PATENT AND TRADEMARK OFFICE
CERTIFICATE OF CORRECTION

PATENT NO. : 4,562,365

DATED : Dec. 31, 1985

INVENTOR(S) : James W. Redfield

It is certified that error appears in the above-identified patent and that said Letters Patent is hereby corrected as shown below:

Col 1 line 16: change "takesup" to - - takes up - -;

Col 1 line 59: change "Fet's" to - - FET's - -;

Col 4 line 17: change before "nodes", "inputs" to - - input - -;

Col 4 line 23: change "an" to - - a - -.

Signed and Sealed this

Fifteenth Day of July 1986

[SEAL]

Attest:

DONALD J. QUIGG

Attesting Officer

Commissioner of Patents and Trademarks